US009444284B2

(12) United States Patent
Schuessler

(10) Patent No.: US 9,444,284 B2
(45) Date of Patent: *Sep. 13, 2016

(54) BI-DIRECTIONAL WIRELESS CHARGER

(71) Applicant: National Semiconductor Corporation, Dallas, TX (US)

(72) Inventor: James E. Schuessler, Grass Valley, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/558,424

(22) Filed: Dec. 2, 2014

(65) Prior Publication Data

US 2015/0084577 A1    Mar. 26, 2015

Related U.S. Application Data

(63) Continuation of application No. 13/044,186, filed on Mar. 9, 2011, now Pat. No. 8,901,875.

(51) Int. Cl.
| | |
|---|---|
| H02J 7/00 | (2006.01) |
| H02J 7/02 | (2016.01) |
| H01M 10/46 | (2006.01) |
| H02J 5/00 | (2016.01) |
| H02J 17/00 | (2006.01) |
| G01R 31/36 | (2006.01) |
| H02J 7/35 | (2006.01) |
| H01M 10/44 | (2006.01) |

(52) U.S. Cl.
CPC ........... *H02J 7/025* (2013.01); *G01R 31/3689* (2013.01); *H01M 10/46* (2013.01); *H02J 5/005* (2013.01); *H02J 7/35* (2013.01); *H02J 17/00* (2013.01)

(58) Field of Classification Search
USPC ........................................ 320/101, 103, 107
See application file for complete search history.

(56) References Cited

U.S. PATENT DOCUMENTS

| | | | | |
|---|---|---|---|---|
| 7,612,527 | B2* | 11/2009 | Hoffman et al. | 320/107 |
| 7,633,263 | B2* | 12/2009 | Toya | 320/108 |
| 2009/0023481 | A1* | 1/2009 | Foster et al. | 455/573 |
| 2009/0096413 | A1* | 4/2009 | Partovi et al. | 320/108 |

* cited by examiner

*Primary Examiner* — Yalkew Fantu
(74) *Attorney, Agent, or Firm* — Andy Viger; Frank D. Cimino

(57) ABSTRACT

A bi-directional charging device includes a rechargeable battery, a coil coupled to the rechargeable battery, a selection mechanism that selectively causes power to be delivered from the coil to the battery and selectively causes power to be delivered from the battery to the coil, and a control mechanism. Upon determining that the coil is to provide power to the battery, the control mechanism causes the selection mechanism to selectively cause power to be delivered from the coil to the battery, and upon determining that the coil is to receive power from the battery, the control mechanism causes the selection mechanism to selectively cause power to be delivered from the battery to the coil.

The bi-directional charging device includes a housing enclosing the rechargeable battery, the coil, the selection mechanism, and the control mechanism.

19 Claims, 5 Drawing Sheets

Bi-directional charging device charges inside bag in power receiving mode.

Bi-directional charging device charges small mobile devices during the day in carry bag in power delivering mode.

BI-DIRECTIONAL WIRELESS CHARGER

BACKGROUND

Rechargeable electronic devices have become ubiquitous to the point that a single individual may own multiple devices that require recharging periodically. Historically, recharging of such devices has been performed through a wired connection to a power source, for example, a cord connected to the device and through a transformer and an electrical wall outlet to a building power main, or a cord connected to the device and through a connector to a vehicle battery. However, it is generally inconvenient to use wired means for recharging, due for example to the difficulty of finding the proper recharging cord, remembering to bring the proper recharging cord along on travels, and finding available outlets for the recharging cord. Thus, it is desirable to have the capability to recharge a device throughout the day without needing to find the appropriate recharging cord and an available outlet.

FIGURES

DETAILED DESCRIPTION

A bi-directional charging device may wirelessly receive power and wirelessly deliver power. When the bi-directional charging device is in the vicinity of a charging bay it may receive power from the charging bay to recharge an internal battery. When the bi-directional charging device is in the vicinity of a rechargeable electronic device it may deliver power to the electronic device for recharging an internal battery of the electronic device. Thus, the bi-directional charging device may be kept near rechargeable electronic devices to recharge batteries in the electronic devices, for example throughout the day. The bi-directional charging device may itself be recharged when it is placed in the vicinity of a charging bay, for example overnight.

Figure 1A:
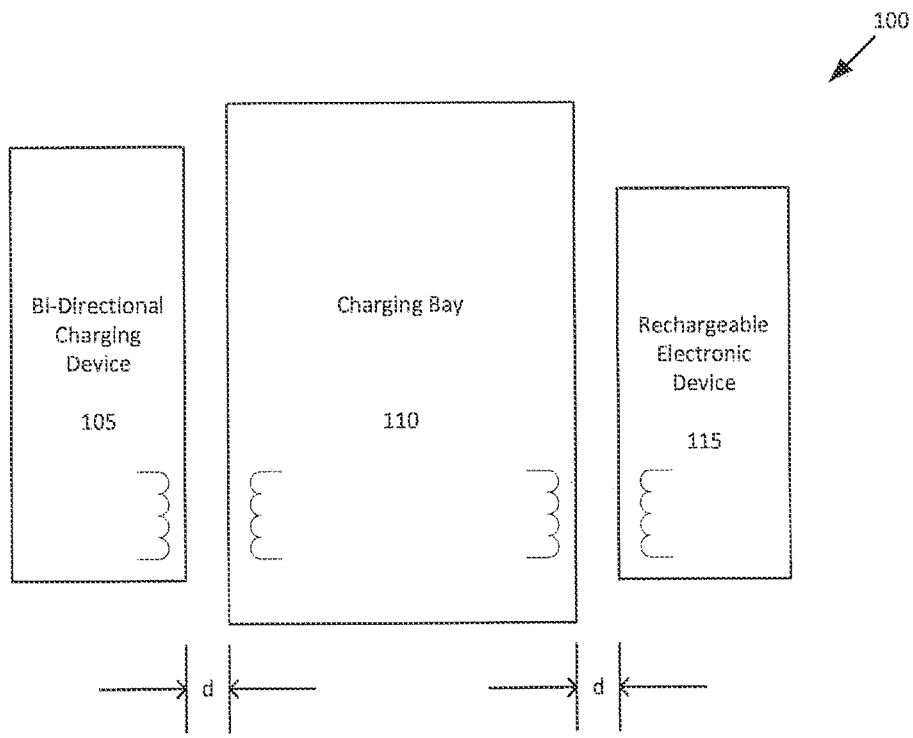
FIG. 1A illustrates an exemplary system for recharging electronic devices in the vicinity of a charging bay.
Figure 1B:
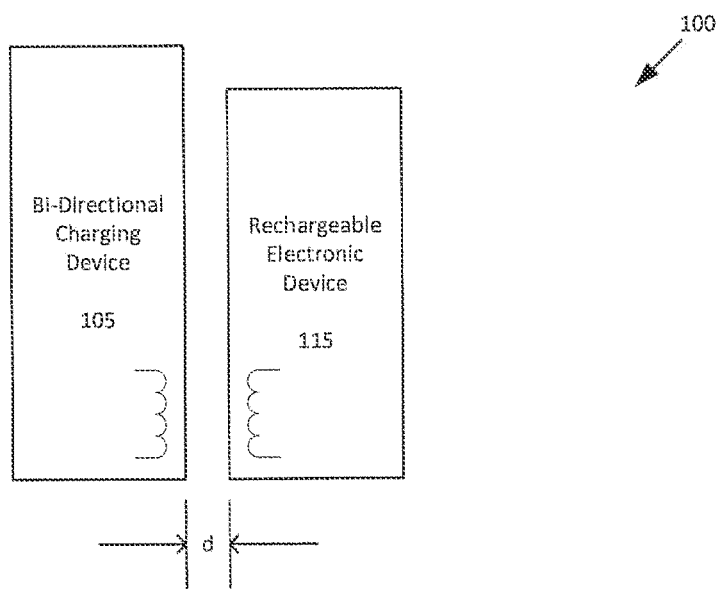
FIG. 1B illustrates an exemplary system for recharging electronic devices away from a charging bay.

FIGS. 1A and 1B illustrate an exemplary system 100 for recharging electronic devices.

FIG. 1A illustrates a bi-directional charging device 105 and a rechargeable electronic device 115 placed in the vicinity of a charging bay 110. In the configuration illustrated in FIG. 1A, bi-directional charging device 105 and electronic device 115 receive power from charging bay 110 wirelessly, for example, through a near field or far field coil-to-coil energy transfer. The distance d between bi-directional charging device 105 and charging bay 110 or between electronic device 115 and charging bay 110 depends on the charging mechanism used. In some implementations, distance d may be small, in terms of a few centimeters. In other implementations, distance d may be several centimeters or meters.

Bi-directional charging device 105 is a portable unit that may be selectively configured to receive power from a charging bay 110 or selectively configured to deliver power, as described below. In some implementations, bi-directional, charging device 105 may be configured only for the receiving or delivering of power. In many other implementations, bi-directional charging device 105 may be configured for the receiving and delivering of power as only one of many functions with device 105. For example, bi-directional charging device 105 may be a portable device such as a notebook computer, laptop computer, tablet computer, or a cellular phone, to name just a few examples. In such a device 105, the device 105 may both use the power received from charging bay 110 and share the power with a rechargeable electronic device 115. In this manner, a portable device may provide power for other portable devices in the vicinity, including providing power for other rechargeable electronic devices 115.

In some implementations, bi-directional charging device 105 is enclosed within a housing formed to at least partially enclose another bi-directional charging device 105 or a rechargeable electronic device 115. For example, a bi-directional charging device 105 housing could be formed to snap on to a rechargeable razor, or formed to be removably attached to a tablet computer.

Bi-directional charging device 105 includes a coil for receiving or delivering power, a rechargeable battery for storing energy, and electronics to control the receiving and delivering of power. Bi-directional charging device 105 is discussed in detail below with respect to FIG. 2.

Charging bay 110 includes at least one coil for delivering power to devices such as bi-directional charging device 105 and rechargeable electronic device 115. Charging bay 110 receives power from an external source. Examples of receiving power from an external power source are being plugged into a main building power supply or a vehicle battery, receiving power through solar cells, or receiving power from internal batteries, to name a few.

Charging bay 110 may include electronics to regulate or allocate power delivery or to monitor conditions for proper operation. For example, if multiple devices 105 and 115 with different charging frequencies are in the vicinity of charging bay 110 at the same time, electronics in charging bay 110 may step through the applicable frequencies in a periodic fashion, thereby charging each device only part of the time but charging all of the devices substantially concurrently. Electronics in charging bay 110 may also, for example, monitor the charging hay 110 power source and select to not provide power to devices 105 and 115 if the power source is below a charge threshold.

Charging bay 110 may be large or small depending on the expected usage model. In some implementations, charging bay 110 may be physically sized to provide charge to only one device 105 or 115 to minimize the physical space occupied. In other implementations in which physical space is not as much of a limiting factor charging bay 110 may be large enough to charge several devices 105 or 115 concurrently. Some examples of charging bay 110 are provided below.

Rechargeable electronic device 115 is generally a portable device, such as a notebook, laptop, or tablet computer, a cellular phone, a razor, a hair dryer, or a hearing aid, to name just a few examples. Rechargeable electronic device 115 includes at least one coil for receiving charge wirelessly and a rechargeable battery that may be charged from the coil.

Device 115 may further include power supply electronics that control and monitor the charging process.

One or more of bi-directional charging device 105, charging bay 110, and rechargeable electronic device 115 may include wireless communication capability such that they may communicate regarding charging needs and status. For example, communication may be through Bluetooth or WiFi or other public or proprietary wireless protocol. Communications may be for example modulated on the energy transfer itself, by modulating a low frequency protocol on a high frequency energy transfer, or by modulating a high frequency protocol on a low frequency energy transfer. Communication may be via an infrared interface, as another example.

When hi-directional charging device 105 or rechargeable electronic device 115 enters the vicinity of charging bay 110, power delivery from charging bay 110 may begin, depending on the internal decisions of and/or communications between the components of system 100. Charging of a device 105 or 115 continues until the device is removed from the vicinity of charging bay 110, until the device is fully charged, or until charging is interrupted. When bi-directional charging device 105 is at least partially charged it may then be used to charge rechargeable electronic devices 115 or other bi-directional charging devices 105.

While being charged by charging bay 110, bi-directional charging device 105 may provide power to charge electronic devices 115. For example, power may be received by bi-directional charging device 105 at one coil and power may be delivered to an electronic device 115 from another coil substantially concurrently. For another example, power may be received by bi-directional charging device 105 at a coil at one frequency and power may be delivered to an electronic device 115 from the same coil at a different frequency substantially concurrently. The capability to both receive power and deliver power substantially concurrently may be used to stack devices on a charging bay 110 for maximum utilization of available surface space of charging bay 110.

FIG. 1B illustrates an exemplary system 100 in which a bi-directional charging device 105 is placed in the vicinity of a rechargeable electronic device 115 away from charging bay 110, in an exemplary configuration for charging the electronic device 115. The distance d between bi-directional charging device 105 and electronic device 115 depends on the charging mechanism used, as described above. The same mechanism used to charge devices 105 and 115 from charging bay 110 may be used to charge rechargeable electronic device 115 from bi-directional charging device 105. For example, rechargeable electronic device 115 may use the same coil for receiving power from bi-directional charging device 105 as used for receiving power from charging bay 110, and bi-directional charging device 105 may use the same coil to provide power to rechargeable electronic device 115 as used for receiving power from charging bay 110. However, in some implementations, bi-directional charging device 105 may use one coil to receive power from charging bay 110 and a separate coil to provide power to rechargeable electronic device 115.

If communication capability is included in both bi-directional charging device 105 and rechargeable electronic device 115 as described above, then the devices may communicate with each other to coordinate energy transfer. Coordination of energy transfer may include beginning and ending energy transfer and status communication during energy transfer.

Figure 2:
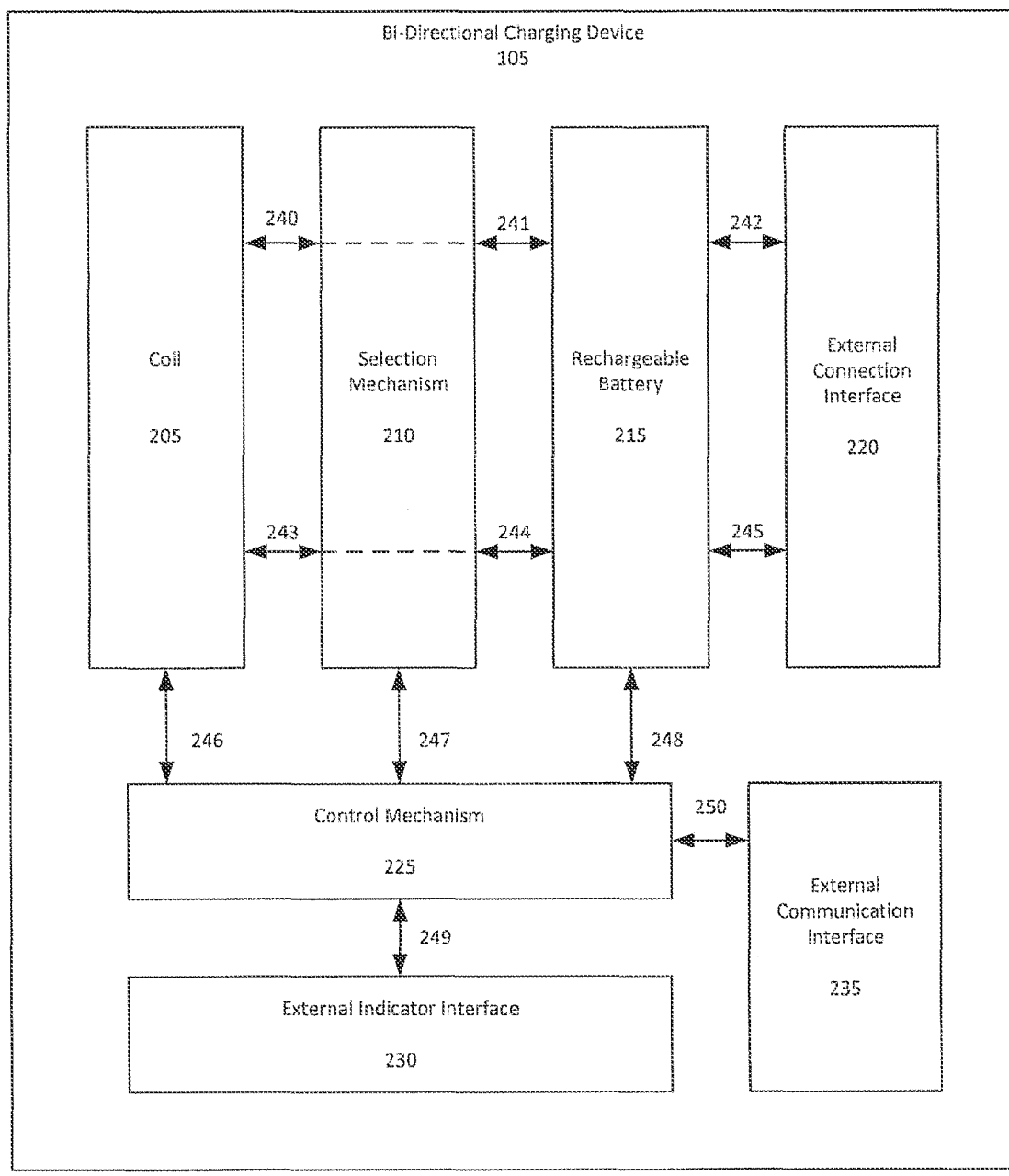
FIG. 2 illustrates an exemplary bi-directional charging device.

FIG. 2 illustrates a block diagram of components of an exemplary bi-directional charging device 200 including a coil 205, a selection mechanism 210, a rechargeable battery 215, an external connection interface 220, a control mechanism 225, an external indicator interface 230, an external communication interface 235, and connections 240-250. Bi-directional charging device 200 may include more or fewer components than those shown. In one implementation, for example, the external connection interface 220, the external indicator interface 230, or the external communication interface 235 may not be included. In another implementation, there may be multiple coils 205 or multiple batteries 215. Other implementations are also possible. In each implementation of a bi-directional charging device 105 at least one coil 205 is selectively used to provide power to at least one rechargeable battery 215 and to receive power from at least one rechargeable battery 215.

Coil 205 is configured to receive or deliver power. Coil 205 may be metal, ceramic, semiconductor material, or other material suitable for forming coils, and may be one or more layers. Thus, coil 205 may be, for example, a ring, multiple layers of rings, a trace around a circuit board, or multiple layers of a MEMS (microelectromechanical systems) device, to name just a few.

Coil 205 generally is coupled to circuitry, not shown in FIG. 2, for the transfer of energy through coil 205. For example, coil 205 may be included in a resonant circuit for energy transfer through resonance. As another example, coil 205 may be included in a switched power amplification circuit. Coil 205 may be included in a wide variety of other circuits for delivering or receiving power. Circuits including coil 205 may include the capability for tuning the energy delivery or receipt frequency.

Coil 205 may represent multiple coils 205. In a first exemplary implementation with multiple coils 205, separate coils are used to receive and to deliver power. In a second exemplary implementation, different coils are used to receive or to deliver power at different frequencies, for example, to power multiple devices in parallel, or to receive power at one frequency and deliver power at another frequency.

Selection mechanism 210 selects the direction of energy transfer, either directing power to rechargeable battery 215 in a power receiving mode or directing power from rechargeable battery 215 in a power delivering mode. In a bi-directional charging device 105 with multiple coils and/or multiple rechargeable batteries 215, there may be multiple concurrent modes such that selection mechanism 210 may direct power from/to multiple coils 205 concurrently, or from/to multiple rechargeable batteries 215 concurrently, or between multiple coils 205 and multiple rechargeable batteries 215 concurrently. For an example of the latter selection, selection mechanism 210 may select power to one or more rechargeable batteries 215 from one or more coils 205 receiving power from an external charging station while selection mechanism 210 concurrently selects power delivery from one or more rechargeable batteries 215 to one or more coils 205 to deliver power to one or more rechargeable electronic devices 115.

Selection mechanism 210 may include electrical and/or mechanical selection. For example, a selection mechanism 210 may be a mechanical switch on the outside of a housing containing bi-directional charging device 105. As another example, selection mechanism 210 may be circuitry internal to bi-directional charging device 105, such as switching circuitry including power FETs (field effect transistors) or other electronic switches. Selection mechanism 210 may be controlled by control mechanism 225, discussed below.

Rechargeable battery 215 represents a device capable of storing charge, accepting charge for storage, and delivering charge from the stored charge. Some examples of rechargeable battery technology include the use of lead-acid; alkaline; combinations with nickel such as nickel-iron, nickel-cadmium, and nickel-zinc; lithium forms or combinations with lithium such as lithium ion, lithium polymer, lithium-sulfur, lithium titanate, and thin film, lithium; and other elemental combinations such as zinc-bromium; sodium-sulfur; and silver-zinc.

Rechargeable battery 215 may represent multiple rechargeable batteries 215, as discussed above. In a bi-directional charging device 105 with multiple rechargeable batteries 215, the batteries 215 may be of different technologies.

External connection interface 220 represents optional interfaces for charging rechargeable battery 215 via a wired interface and/or providing power to external devices via a wired interface. External connection interface 220 may include a connector accessible outside of the housing of bi-directional charging device 105 for plugging in a mating connector, and may further include hardware, firmware, and/or software internal to the housing for making a proper connection. For example, an external connection may be a USB (universal serial bus) cable from a computing device. The USB cable in this example may be plugged into a USB connector in the housing of the bi-directional charging device 105, and a USB hardware/firmware/software interface within external connection interface 220 may perform the necessary handshaking to start and stop power delivery from the computing device to the rechargeable battery 215. Similarly, as another example, external connection interface 220 may include a USB internal interface and a mini-USB connector for charging a rechargeable electronic device 115 via a USB cable.

External connection interface 220 may include, for a further example, an interface to a solar panel affixed or removably attached to a housing of bi-directional charging device 105 for charging rechargeable battery 215. External connection interface 220 may include additionally or alternatively interfaces to other external power sources.

Connections 240-245 represent the physical connections between components 205, 210, 215, and 220 for the delivery of power within bi-directional charging device 105. Connections 240-245 may be, for example, wires crimped or soldered to connector pins, or traces on a printed circuit board.

Control mechanism 225 represents the control hardware, firmware, and/or software that determines the mode for the bi-directional charging device 105, for example, a power receiving mode or a power delivering mode. As discussed above, there may be multiple concurrent modes.

Control mechanism 225 may be coupled via connection 246 to coil 205 or the circuitry around coil 205 (not shown) to receive information or to provide adjustment. For example, control mechanism 225 may include a circuit for reading the voltage at a node of coil 205, or for reading the current through coil 205. Other information may also be received from coil 205 or the circuitry around coil 205, and control mechanism 225 may use the information received to determine whether conditions are appropriate to begin or continue energy transfer. For example, if current in coil 205 crosses a low or high threshold, control mechanism 225 may determine that there is a failure in the coil 205 or associated circuitry and that energy transfer should be terminated.

Control mechanism 225 may provide adjustment to coil 205, for example, by using coil 205 to determine the frequency of an external device such as charging bay 110 or rechargeable electronic device 115, then tuning coil 205 and/or the associated circuitry to the determined frequency for better power delivery.

Control mechanism 225 may be coupled via connection 248 to rechargeable battery 215 to receive information or provide adjustment. For example, control mechanism 225 may include a circuit for reading the voltage across a cell of rechargeable battery 215. Other information may also be received from rechargeable battery 215, and control mechanism 225 may use the information received to determine whether conditions are appropriate to begin or continue energy transfer. For example, if control mechanism 215 determines that the battery state of charge is low, then control mechanism 215 may prevent an attempted energy transfer from rechargeable battery 215.

Control mechanism 225 may provide adjustment to rechargeable battery 215, for example, adjusting the rate of charge transfer to or from rechargeable battery 215.

Control mechanism 225 may be coupled via connection 247 to selection mechanism 210 to control the direction of energy flow between coil 205 and rechargeable battery 215. For example, in an implementation in which selection mechanism 210 contains FETs to couple coil 205 to rechargeable battery 215, the FETs may be turned on and off by electrical signals from control mechanism 225.

Control mechanism 225 may be additional to an external selection option such as a switch accessible on the outside of the housing of bi-directional charging device 105. In an implementation with such an external switch, control mechanism 225 may monitor the conditions of coil 205 and rechargeable battery 215 and determine if energy transfer should be discontinued. For example, when rechargeable battery 215 is fully recharged, battery 215 may be disconnected from coil 205 regardless of the state of the external switch.

External indicator interface 230 represents optional indicators viewable on the outside of a housing containing bi-directional charging device 105, and control for the indicators. Indicators may include without limitation LEDs (light emitting diodes) and alphanumeric character displays. Indicators may provide, for example, information regarding energy transfer mode, or status of rechargeable battery 215. In one implementation, external indicators include an indication of battery state of charge for rechargeable battery 215 and an indication of whether an energy transfer is in progress. Other indications may include as appropriate indications for multiple rechargeable batteries 215 or multiple cells of one or more batteries 215.

External indicator interface 230 may be coupled via connection 249 to control mechanism 225 to receive control information or to provide status information. For example, control mechanism 225 may send a command to indicate full battery charge, and external indicator interface 230 may cause the text "100%" to appear on an alphanumeric display. As another example, control mechanism 225 may assert a voltage on a control signal to an LED in external indicator interface 230 to cause the LED to emit light. External indicator interface 230 may provide status information to control mechanism 225, for example providing "indicator on" status or the like.

External communication interface 235 optionally provides the capability for communication with external devices such as charging bay 110 or rechargeable electronic device 115, as discussed above. External communication interface 235 includes the hardware, firmware and/or software necessary for communication through the implemented protocol. For example, interface 235 may include integrated circuit transceiver chips with associated circuitry and multiple levels of software to enable communications using Bluetooth protocol.

External communication interface 235 may be coupled via connection 250 to control mechanism 225. For example, external communication interface 235 may perform handshaking with an external device, and then inform control mechanism 225 of an amount of charge needed and a preferred frequency to use for delivering power to the external device based on a power delivery request from the external device. Control mechanism 225 in this example may then configure rechargeable battery 215 and coil 205 to deliver the appropriate charge at the appropriate frequency and may cause selection mechanism 210 to couple coil 205 to rechargeable battery 215.

External communication interface 235 may be used by bi-directional charging device 105 to make requests to external devices for charging. For example, upon recognizing that a charging bay 110 is in the vicinity, bi-directional charging device 105 may request the charging bay 110 to begin delivering power.

External communication interface 235 may receive information from control mechanism 225 to deliver to an external device, such as expected time required for charging, or available charging frequencies. An external device may notify bi-directional charging device 105 that charging is complete, and control mechanism 225 may then cause selection mechanism 210 to decouple coil 205 from rechargeable battery 215.

Bi-directional charging device 105 may include combinations of discrete and integrated components. For example, control mechanism 225 may include a processor implemented on a semiconductor device, and discrete input/output circuitry for the processor. Further, multiple functions or portions of functions may be integrated within one or more semiconductor devices. For example, portions of selection mechanism 210, external connection interface 220, control mechanism 225, external indicator interface 230, and external communication interface 235 may all be integrated within one semiconductor device.

Connections 246-250 represent the physical connections between control mechanism 225 and components 205, 210, 215, 230, and 235 for the transfer of information within bi-directional charging device 105. Connections 246-250 may be, for example, wires crimped or soldered to connector pins, traces on a printed circuit board, or connections within a semiconductor device.

A housing encompassing bi-directional charging device 105 may be formed to fit over another bi-directional charging device 105 or a rechargeable electronic device 115. For example, a housing may be formed to at least partially enclose a telephonic device to provide for an extension of the telephonic device's battery life while leaving at least part of the functionality of the telephonic device available for use.

Thus is described an exemplary bi-directional charging device 105 that may receive power or deliver power. Examples of how a bi-directional charging device 105 may be used in a system 100 are illustrated below.

Figure 3A:
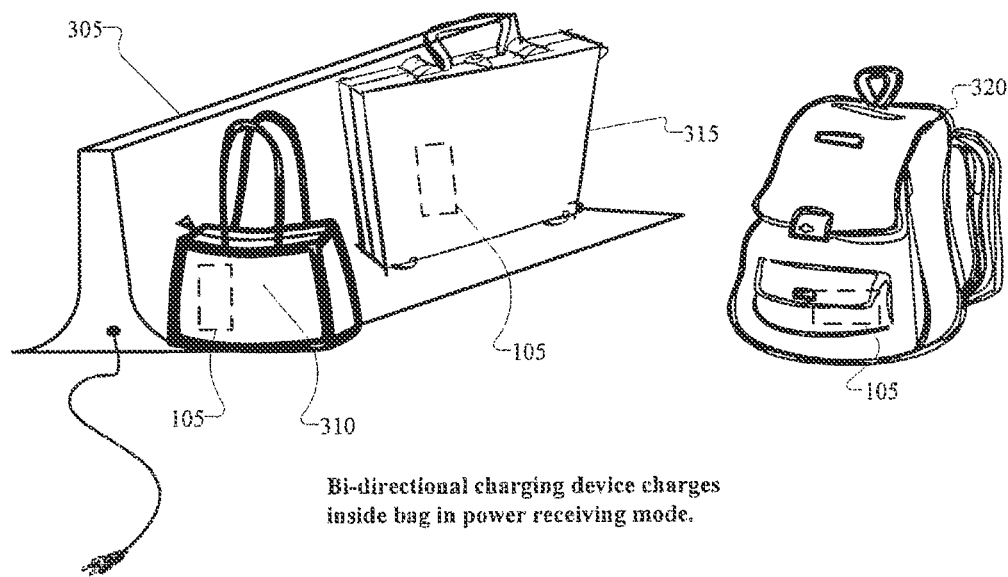
FIG. 3A illustrates an exemplary charging bay with various bags placed in position for recharging electronic devices within the bags.

FIG. 3A illustrates an exemplary charging bay 305 that may be plugged into a wall receptacle for connection to a building main power supply. A charging bay such as bay 305 may be placed in an entryway or a corner or the like so that as occupants of the building enter, they may place a bag on charging bay 305. Inside the bag is a bi-directional charging device 105 to be charged from charging bay 305. Exemplary bags illustrated in FIG. 3A are a handbag 310, briefcase 315, and backpack 320 each containing one bi-directional charging device 105. Of course, more than one bi-directional charging device 105 may be carried in a bag. As a bag is placed on charging bay 305, a bi-directional charging device 105 inside the bag may recognize the presence of charging bay 305 and begin receiving power from charging bay 305. Bi-directional charging device 105 may recognize the presence of charging bay 305 by, for example, recognizing that a large power source at an appropriate frequency is nearby, or by communicating with charging bay 105 through external communication interface 235.

In some implementations, charging bay 305 may be able to charge a bi-directional device 105 from a distance. For example, as illustrated in FIG. 3A, backpack 320 is placed a distance from charging bay 305, but may still be able to receive energy transfer from charging bay 305 if the energy transfer mechanism is able to span the distance.

Figure 3B:
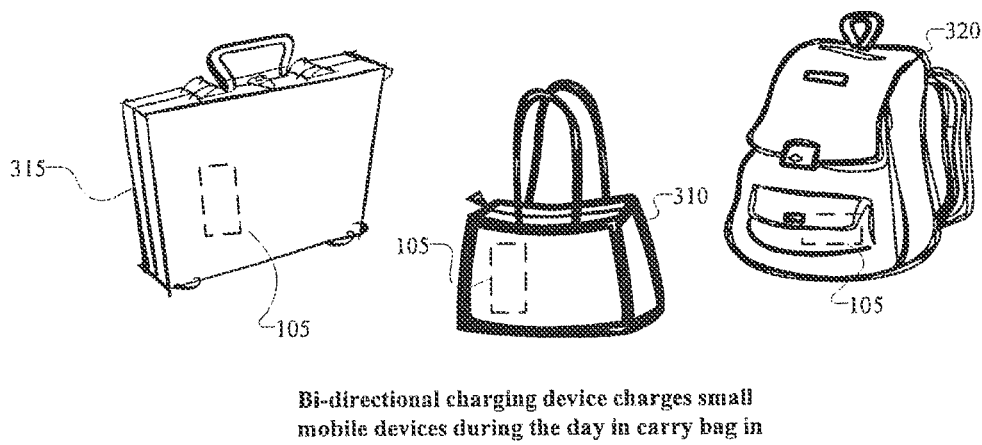
FIG. 3B illustrates bags containing electronic devices being recharged by bi-directional charging devices.

FIG. 3B illustrates briefcase 315, handbag 310, and backpack 320 removed from charging bay 305. If the bi-directional charging devices 105 within the bags are charged at least partially, they may be used to charge rechargeable electronic devices 115 within the bags, as well as charging other bi-directional charging devices 105. Bi-directional charging device 105 determines if it has enough charge to provide power to a rechargeable electronic device 115 or other bi-directional charging device 105, and may provide power as requested. A request may come, for example, from a rechargeable electronic device 115 or other bi-directional charging device 105 in the form of a communication through external communication interface 235, or by a signal emitted by rechargeable electronic device 115 indicating less than a full charge.

The charging bay 305 illustrated in FIG. 3A is just one example for the design of a charging bay 305, which may be decorative as well as functional, and may, for example, be built into furniture or cabinetry. In one implementation, charging bay 305 may be a panel in a desk. If the energy transfer mechanism spans long distances, charging bay 305 may be hidden, for example, in a ceiling tile.

Figure 4:
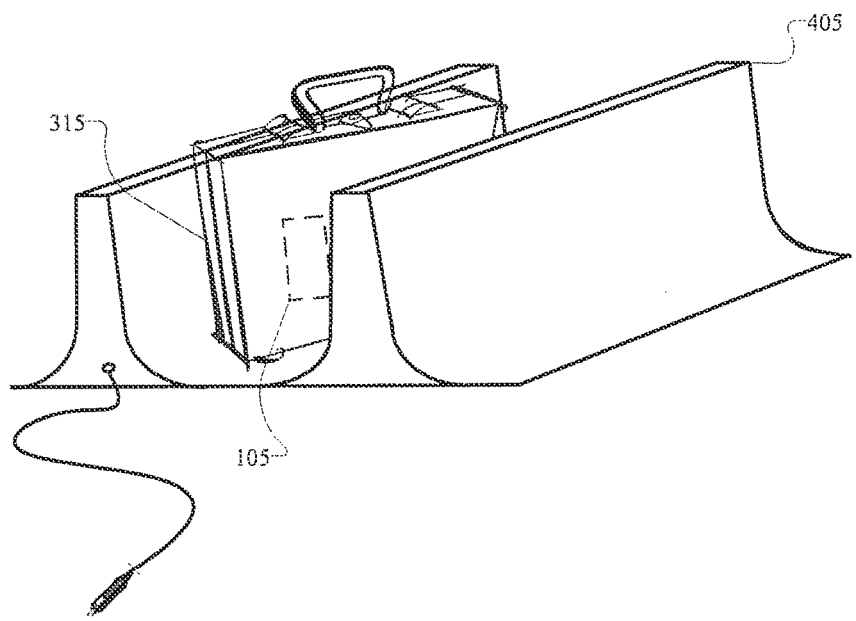
FIG. 4 illustrates an exemplary charging bay for a vehicle.

FIG. 4 illustrates a charging bay 405 for placement in a vehicle. Charging bay 405 includes support to keep the bag from falling away from the charging bay 405 as the vehicle moves. In the illustrated implementation, charging bay 405 includes a power plug for connecting to a vehicle charging port. For example, charging bay 405 may be placed in the passenger floorboard and plugged into a power receptacle of the dashboard structure. In another example, charging bay 405 may be placed in the vehicle trunk or rear enclosure and plugged into a local power receptacle. Briefcase 315 is shown cradled inside charging bay 405, illustrating recharging a bi-directional charging device 105 within briefcase 315 while the vehicle is operating.

Figure 5:
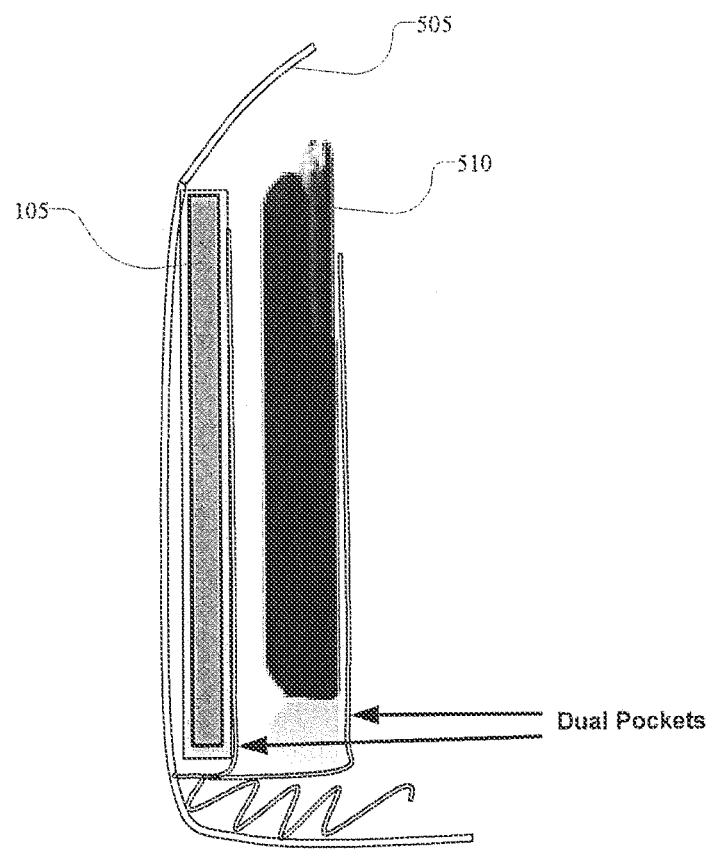
FIG. 5 illustrates exemplary placement of a bi-directional charging device and a rechargeable electronic device in a bag.

FIG. 5 illustrates a close-up side view of a portion of the inside of an exemplary bag 505 with dual pockets, a first pocket containing a bi-directional recharging device 105 and a second pocket containing a rechargeable electronic device 510 illustrated as a smart phone. In this implementation, each time the phone is placed in the pocket it may initiate an energy transfer such that the phone may be recharged when not in use. In another implementation, not shown, a smart phone may be the bi-directional charging device 105, and the smart phone may provide power for a rechargeable headphone, for example.

Multiple bi-directional charging devices 105 may be within charging distance of each other. In such cases, one of the bi-directional charging devices 105 may charge another bi-directional charging device 105. A protocol may be implemented for determining which of multiple devices 105 is to provide charge and which is to receive charge. For example, a protocol may include a determination within one or more bi-directional charging devices 105 as to battery state of charge and expected battery life at the present rate of use and a further determination of whether a device 105 has reached a critical battery state of charge. A protocol may include a heuristic to automatically determine whether a device 105 should be used to charge another device 105. A protocol may include a user notification on a first device 105 that a second device 105 in the vicinity needs to be charged, and that the expected battery life of the first device 105 will be reduced by an amount if the first device 105 is used to charge the second device 105. A user interface on the first devices 105 may allow a user to direct that charge be provided to the second device 105, or direct that no charge be provided to the second device 105. Many other protocols may be implemented to address the situation in which multiple bi-directional recharging devices 105 are within charging distance of each other wherein each device 105 may have a different level of battery charge.

CONCLUSION

A bi-directional charging device may wirelessly receive power for recharging an internal rechargeable battery, and may wirelessly deliver power to charge the battery of an external rechargeable electronic device.

The above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. An apparatus, comprising:
    a rechargeable battery;
    a coil coupled to the rechargeable battery;
    a selection mechanism that selectively causes power received wirelessly through the coil to be provided from the coil to the battery for wireless charging, and selectively causes power to be provided from the battery through the coil for wireless power transfer; and
    a control mechanism that
        upon determining that the coil is to provide power to the battery for wireless charging, causes the selection mechanism to selectively cause power to be provided from the coil to the battery; and
        upon determining that the coil is to receive power from the battery for wireless power transfer, causes the selection mechanism to selectively cause power to be provided from the battery to the coil;
    a housing including the rechargeable battery, the coil, the selection mechanism, and the control mechanism.

2. The apparatus of claim 1, further comprising:
    first and second coils;
    the selection mechanism configured to
        provide power from the first coil to the battery; and
        provide power from the battery to the second coil.

3. The apparatus of claim 1, further comprising a solar panel attached to the housing.

4. The apparatus of claim 1, further comprising:
    at least one indicator viewable on a surface of the housing that indicates the battery state.

5. The apparatus of claim 4, battery e including one of a battery state of charge, a selection of power being provided from the coil to the battery, a selection of power being provided from the battery to the coil, and low battery.

6. The apparatus of claim 1, further comprising:
    a connection mechanism accessible on the surface of the housing, the connection mechanism configured to couple power from an external energy source to the rechargeable battery.

7. The apparatus of claim 6, the connection mechanism being at least one of a USB (universal serial bus) and a mini-USB interface.

8. The apparatus of claim 1, further comprising:
    a protective cover for the housing.

9. The apparatus of claim 1, the rechargeable battery being one of a plurality of rechargeable batteries in the housing.

10. The apparatus of claim 1, the coil being one of a plurality of coils in the housing.

11. The apparatus of claim 1, further comprising:
    a communication interface configured for communicating with external devices to coordinate transfers of energy.

12. The apparatus of claim 11, the apparatus receiving a request via the communication interface from an external device to provide power to the external device, and providing power to the external device based on the request.

13. The apparatus of claim 12, the request including a preferred frequency for receiving an energy transfer.

14. The apparatus of claim 11, the apparatus making a request via the communication interface to an external device for the external device to provide power to the apparatus.

15. The apparatus of claim 11, the external device being one of a portable computer and a mobile telephone.

16. A method suitable for implementing a bi-directional charging device based on bi-directional wireless power transfer, comprising:
    receiving in the bi-directional charging device a request via a communication interface, the request being from a first external device, and the request being to provide power to the first external device;
    sending from the bi-directional charging device a request via the communication interface to a second external device, and the request being to wirelessly receive power from the second external device;
    controlling a selection mechanism to
        for the request to provide power, route power from a rechargeable battery through at least one a coil for delivering power to the first external device by wireless power transfer; and for the request to receive power, route power received from the second external device through the at least one coil to the rechargeable battery for wirelessly charging the rechargeable battery;
the selection mechanism, the rechargeable battery, and the coil being within the bi-directional charging device.

17. The method of claim 16, wherein the selection mechanism is controlled to route power received from the second external device through a second coil in the bidirectional charging device to the rechargeable battery.

18. The method of claim 16, the first external device being one of a portable computer and a mobile phone, and the second external device being a wireless charging pad.

19. The method of claim 16, the bi-directional charging device being a first bi-directional charging device and the second external device being a second bi-directional charging device.

\* \* \* \* \*